United States Patent [19]

Chu et al.

[11] 4,238,274

[45] Dec. 9, 1980

[54] METHOD FOR AVOIDING UNDESIRABLE DEPOSITS IN CRYSTAL GROWING OPERATIONS

[75] Inventors: Tze Y. Chu, Trenton, N.J.; Yogesh Jaluria, Kanpur, India; Robert J. Lavigna, Bath, Pa.; Raymond E. Reusser, Bethlehem, Pa.; George Williams, Mercerville, N.J.

[73] Assignee: Western Electric Company, Inc., New York, N.Y.

[21] Appl. No.: 925,146

[22] Filed: Jul. 17, 1978

Related U.S. Application Data

[62] Division of Ser. No. 750,985, Dec. 15, 1976, Pat. No. 4,116,642.

[51] Int. Cl.$^3$ .............................................. C30B 5/00
[52] U.S. Cl. ..................... 156/617 SP; 156/DIG. 83
[58] Field of Search ......... 156/617 SP, 620, DIG. 83, 156/617 R, 617 V, 619

[56] References Cited

U.S. PATENT DOCUMENTS

| | | | |
|---|---|---|---|
| 3,261,671 | 7/1966 | DeJonge et al. | 156/617 SP |
| 3,298,795 | 1/1967 | Hamilton et al. | 156/619 |
| 3,798,007 | 3/1974 | Bochman et al. | 156/619 |
| 3,833,342 | 9/1974 | Holliday et al. | 156/617 SP |
| 4,141,779 | 2/1979 | Hill et al. | 156/617 SP |

FOREIGN PATENT DOCUMENTS

729096  3/1966  Canada.

*Primary Examiner*—Bradley R. Garris
*Attorney, Agent, or Firm*—D. C. Watson; G. W. Houseweart

[57] ABSTRACT

In Czochralski crystal growing operations, particularly those involving growth of silicon crystals, projecting formations of silicon monoxide, which sometimes form on the surface of the melt-containing crucible just above the surface of the melt, are avoided by perturbing the formation conditions at the region of probable formation. Such perturbations may include increasing the temperature of the crucible at the region of probable formation. The increase in temperature may be provided by including an aperture in the housing which surrounds and supports the crucible to enable locally greater radiative heating of the crucible in the region of probable formation. Other expedients for locally increasing the temperature of the crucible include, without limitation, selective frosting and other techniques for locally changing the emissivity characteristics of the crucible and/or the surrounding material.

5 Claims, 2 Drawing Figures

METHOD FOR AVOIDING UNDESIRABLE DEPOSITS IN CRYSTAL GROWING OPERATIONS

BACKGROUND OF THE INVENTION

This is a division of application Ser. No. 750,985, filed Dec. 15, 1976, now U.S. Pat. No. 4,116,642.

This invention relates to methods and apparatus for avoiding undesirable growths, deposits and other formations in crystal growing operations; and, more particularly, to methods and apparatus for avoiding formation of projecting "whiskers" of silicon monoxide on the inner wall of a melt-containing crucible in Czochralski crystal growing operations.

It is conventional to provide single crystalline forms of many solid materials by preparing a melt of the material, and contacting the surface of the melt with a previously prepared seed crystal of the material of the desired crystalline lattice orientation. The seed crystal is withdrawn from the melt at a rate of the order of a few inches per hour, while the crystal and the melt are counter-rotated with respect to each other.

Typically, the chamber in which the crystal is grown is first partially evacuated and then backfilled to a positive pressure with a continuing flow of a gas, such as argon, which serves as the ambient during the crystal growth. The positive pressure aids in avoiding entrance of undesired contaminants into the system during the growth. With this described technique, commonly termed the Czochralski technique, crystals several feet in length and several inches in diameter are routinely grown, particularly by workers in the silicon semiconductor technologies.

Particularly, in the silicon semiconductor technologies, the melt, which may be at an average temperature of 1420° Centigrade, typically is contained in a quartz (silicon dioxide) crucible. At the temperature involved, reaction of the quartz crucible with the molten material occurs, and thus provides a source of oxygen which, in turn, reacts with the molten silicon to produce silicon monoxide. The silicon monoxide is given off in vapor form from the melt and tends to preferentially condense, grow, or otherwise form dendrites, i.e., projecting growths, on what are apparently nucleation sites on the inner wall of the crucible just above the initial level of the melt surface during growth of the crystal.

These dendrites extend radially inward from the inner wall of the crucible, and often become dislodged and drop into the melt, where convection currents or other flow patterns can carry them to the growing crystal. Upon contact with the growing crystal, the desired crystalline structure usually is lost and any further growth would produce undesirable material.

SUMMARY OF THE INVENTION

In view of the aforementioned and other problems inherent in conventional methods and apparatus for growing single crystalline material, it is an object of this invention to provide new and improved methods and apparatus for growing crystals, wherein growths, deposits, or other formations of undesirable material in a crystal grower during a crystal growing cycle are avoided.

The aforementioned and other objects are achieved in accordance with this invention by perturbing the conditions at the region of probable formation. In accordance with one embodiment of the invention, the formation conditions are thermally perturbed by providing supplemental heating to the portion of the crucible at the region of probable formation, i.e., above the melt surface.

Providing the supplemental heating to the portion of the crucible above the melt surface is accomplished in accordance with one embodiment of this invention in a crystal grower heated by thermal resistance heating, by providing an aperture in the housing surrounding the crucible at the region of probable formation. The portion of the crucible exposed through the aperture experiences locally greater radiative heating than it would if surrounded and shielded by the housing material.

In accordance with other embodiments of this invention, the supplemental heating may, for example, and without limitation, be provided by: using, for the housing surrounding the crucible, a material having a greater conductance at the region of probable formation; using a housing having a thinner wall at the region of probable formation; using a particular heater configuration to provide more heat at the region of probable growth; frosting the surface of the crucible at the region of probable formation to locally change the emissivity and absorptance characteristics of the crucible at that region; otherwise increasing the absorptance of the crucible, e.g., by dyeing it, at the region of probable formation; and/or providing locally greater heating by other means such as radio frequency heating, in combination with the thermal resistance heating.

DESCRIPTION OF THE DRAWING

The aforementioned and other features, characteristics and advantages, and the invention in general will be better understood from the following, more detailed description taken in conjunction with the accompanying drawing in which.

DETAILED DESCRIPTION

For simplicity and clarity of explanation, the invention will be described hereinafter principally in connection with the Czochralski-type crystal grower adapted for producing a silicon crystal from a silicon melt which may, but need not, be doped with an impurity for determining the conductivity type and resistivity of the grown crystal. However, it is to be understood that the invention is not so limited but rather is applicable to other types of processes and apparatus for growing crystals, wherein avoidance of undesirable formations within the crystal growing apparatus is desired.

Figure 1:
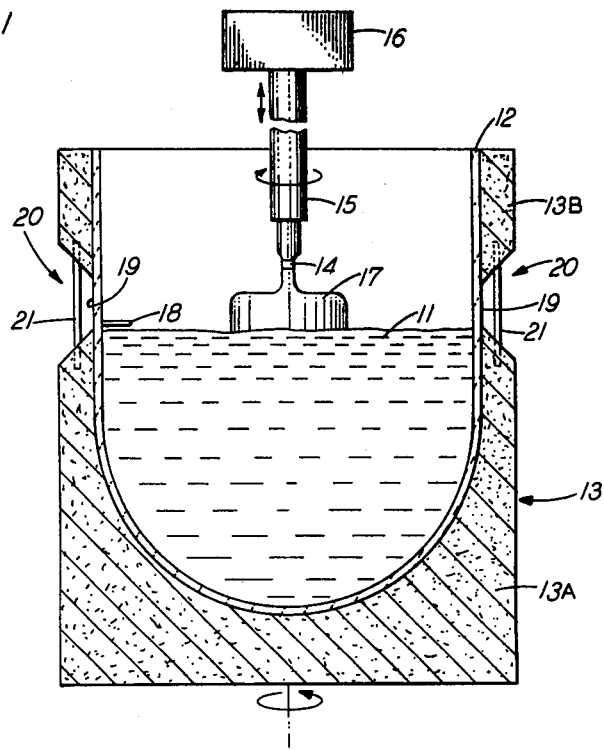
FIG. 1 illustrates a portion of a crystal grower including a melt and further including an aperture in a housing surrounding and supporting a crucible containing the melt, for enabling locally greater heating of the portion of the crucible at the region of probable dendritic formation, i.e., just above the melt surface.

With reference now to FIG. 1, there is shown in cross-sectional view a quantity of molten silicon 11, termed a "melt", confined in a quartz crucible. Crucible 12 is surrounded and supported by a thermally conductive, radiation-absorbing housing 13.

Housing 13 typically is of graphite, and, in the art, is generally termed a "susceptor" for historical reasons. In early crystal growers, heating was provided primarily by radio frequency heating; and the housing 13 operated as a susceptor to convert the radio frequency energy into thermal energy. However, with the use of larger masses of molten material as the art progressed, radio frequency heating was largely supplanted by thermal resistance, radiative-type heating. Conventional heating arrangements, including thermal resistance heating, may be used in accordance with this invention.

Referring again to FIG. 1, in operation a seed crystal 14 is held on the end of a seed shaft 15, which in turn is supported by a mechanism 16, capable of rotating shaft 15 and moving shaft 15 vertically. The free end of the seed 14 is touched to the surface of the molten material 11, while the crucible and the seed shaft 15 are counter-rotated, i.e., in opposite directions.

After the seed crystal 14 is touched to the surface of the molten material 11, and provided that the temperature and other conditions known to those in the art are proper, the molten material solidifies on the seed crystal 14 with the same lattice orientation as the seed crystal. By slowly withdrawing the seed crystal, typically at the rate of the order of a few inches per hour, and rotating the seed shaft 15 and seed crystal 14 affixed thereto, a single crystalline ingot 17 is formed from the molten material.

Operation of at least one type of Czochralski-type crystal grower is described in U.S. Pat. No. 3,679,370, issued July 25, 1972, to J. J. Czeck et al., and further details of operation may be found in U.S. Pat. No. 3,698,872, issued Oct. 17, 1972, to R. E. Reusser, both indicated patents being assigned to the assignee hereof.

As mentioned hereinabove, in operation it is not uncommon to have projecting formations 18, commonly termed "whiskers," of silicon monoxide forming on the inner surface of the crucible 12 just above the initial level of the melt during growth of a silicon ingot 17. Whiskers 18 are a problem when they become detached from the crucible and travel through the melt, due to convection currents and other flow patterns in the melt, to the solid-liquid interface at the growing crystal 17, where they can destroy the desired single crystalline structure and render any further crystal growth fruitless.

In accordance with this invention, formation of whiskers 18 is avoided by perturbing the formation conditions at the region of probable formation. In one class of embodiments of this invention, the formation condition perturbation is provided by perturbing the temperature of the crucible at the region of probable formation.

In FIG. 1, there is illustrated one technique for providing supplemental heating to a portion of the crucible above the surface of the melt 11. This is accomplished in a system particularly adapted for thermal resistance heating means 22, by providing an aperture 20 in radiation-absorbing housing 13. Aperture 20 permits greater radiative heating of the outer surface of portion 19 of the crucible than would be provided if portion 19 of the crucible were shielded from the radiation by the material of housing 13, as is the case in conventional crystal growing apparatus.

As illustrated in FIG. 1, housing 13 comprises two parts, a lower portion 13A, and an upper portion 13B. Upper portion 13B is supported relative to lower portion 13A by a plurality of pins 21. Pins 21 are typically of a refractory material, such as molybdenum, to withstand the temperatures involved and are arranged at equal annular spacings. Typically, three pins disposed at 120° increments around the crucible 12 can be used, and the pins may, for example, be about ⅛" in diameter and three to four inches long. The aperture typically is one-half inch in width but may be of greater or lesser width, as desired, to achieve the effective elimination of whisker growth.

Crucible 12 and radiation-absorbing housing 13 there surrounding, typically in the art are of circular cross-section; and it is contemplated that aperture 20 extends around the entire periphery of crucible 12. Such extension, however, is not required in accordance with this invention. Rather a plurality of discrete apertures may be employed, in which case the supporting pins may not be needed, all depending of course on the relative size of the apertures with respect to the circumference of housing 13.

Figure 2:
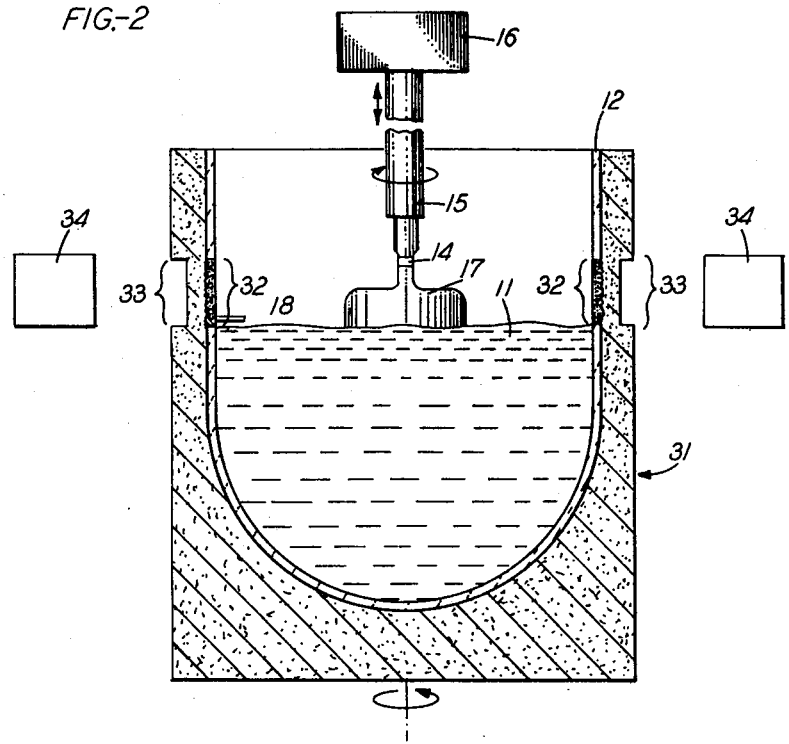
FIG. 2 illustrates a portion of a crystal grower including a melt and also including other expedients in accordance with other embodiments of the invention for perturbing the formation conditions at a portion of an inner wall of a melt-containing crucible.

With reference now to FIG. 2, there is illustrated apparatus similar in many respects to that of FIG. 1, except that alternative expedients for providing the supplemental heating are illustrated. Reference numerals are repeated where appropriate to show corresponding elements of the drawing. Housing 13 of FIG. 1 has been renumbered 31 in FIG. 2 because of a significant change in structure between the two figures.

In FIG. 2, housing 31 is shown to have a thinner wall in a region 33, adjacent a portion 32 of probable "whisker" formation, to permit greater heating through the thinner wall in accordance with the same principles involved in use of an aperture, i.e., by providing reduced resistance to heating of portion 32.

Also shown in FIG. 2 is a supplementary heating means 34 substantially aligned with portion 32 and region 33 providing locally additional heating to those portions. Supplementary heating means 34 may be of the radio frequency type, thermal resistance type or other suitable type which will be apparent to those in the art, and, of course, are in addition to the principal heating elements of the system which are conventional and are not shown.

Also shown in FIG. 2 is that the portion 32 of crucible 12, i.e., the region of probable formation, is frosted on the outside thereof, as indicated by the jagged interface between crucible 12 and housing 31 in portion 32, to locally change the emissivity characteristics of portion 32 to locally increase the absorptance of the crucible at portion 32. As is also indicated by the dense stippling of portion 32 of crucible 12, absorptance of the crucible at portion 32 may be increased by selectively coloring or shading or including a layer (not shown) on the outside thereof between the crucible 12 and housing 31 to provide locally greater absorption of heat through region 33 of the housing.

It should be understood that whatever technique is used to provide the supplemental heating, one must avoid significant heating of the growing crystal 17 to an extent sufficient to adversely affect the growing crystal. It is for this reason, of course, as well as for other reasons, that one cannot avoid the whisker formation by simply providing more heat to the entire crystal growing apparatus during the growth cycle. The above-described techniques for providing sufficient supplemental local heating during the growth cycle to avoid "whisker" growth can be and are adapted to avoid adversely affecting the growing crystal 17.

Although it has long been known that once a "whisker" has formed, it can be burned away by first removing the grown crystal, if any, from the system and then applying more than normal heat to raise the system temperature significantly above normal, such is not a practical solution to the whisker problem. First, premature withdrawal of the crystal is inefficient and uneconomical. Second, and perhaps more important, the excessive heating causes oxygen and other impurities to move from the crucible into the melt and thus deleteriously affect the melt. Also, the excessive heating causes significant evolution of silicon monoxide which deposits on other interior surfaces of the systems. For all these and other reasons, raising the overall system temperature is not a feasible solution to the "whisker" formation problem.

The exact mechanism by which "whisker" formation is avoided by providing greater radiative energy to that portion of the crucible where such "whiskers" are likely to form is not completely understood. More specifically it is known that quartz, which is typically used for the crucible, is relatively highly transmissive for radiation of the type involved. For this reason, if may be that the crucible itself is not heated to a temperature sufficient to avoid whisker formation. Rather, it may be that any incipient undesirable formation is itself heated by the radiative energy and thus becomes burned away before an appreciable formation can occur. In any event, "whisker" formation is avoided by expedients of the kind described hereinabove.

At this point, it is believed the principles of this invention have been described in sufficient detail to enable one skilled in the art to practice the invention. Although the invention has been described in part by making detailed reference to specific embodiments, such detail is intended to be and will be understood to be instructive rather than restrictive. It will be appreciated by those skilled in the art that many variations can be made in the structure and in the modes of operation without departing from the spirit and scope of the invention as disclosed in the foregoing teachings.

For example, it will be apparent that each of the techniques illustrated in FIG. 2 for enabling locally greater heating of the crucible in portion 32 may be used separately or in combinations, rather than the simultaneous use of all such techniques, as shown in FIG. 2. Further, of course, if will be apparent that one or more of the techniques for locally greater heating illustrated in FIG. 2 may be used in combination with techniques illustrated in FIG. 1 and described with respect thereto.

Also, of course, it should be appreciated that in systems using radio frequency heating, the supplemental heating of the region of probable "whisker" formation can be achieved by providing a susceptor (housing 31) having a greater susceptance adjacent to that region. Similarly, in radiatively heated systems, the susceptor can be adapted to include a material having greater thermal conductance adjacent to the region of probable formation than elsewhere.

What is claimed is:

1. A method of growing a single crystalline form from a melt comprising:
    providing a quantity of a material in a crucible;
    supporting the crucible with a housing surrounding said crucible;
    heating the material in the crucible to at least a temperature at which the material melts;
    supporting and pulling a crystalline form of the material with respect to the melt; and
    providing supplemental, locally intensified heat at an inner annular wall portion of the crucible located just above the surface of the melt by providing less resistance to the transmission of heat to said portion than to other areas of the crucible wall, said heat provided at said portion being sufficiently intense to prevent undesirable formation of material thereupon.

2. A method as recited in claim 1, including providing an aperture in the housing adjacent to said portion of the crucible above the melt surface, the supplemental heat being transmitted primarily through said aperture.

3. A method as recited in claim 1, wherein the housing is transmissive of heat to the wall of the crucible and including providing a thinner wall in that portion of the housing adjacent to said portion of the crucible above the melt surface than in other portions of the housing, the supplemental heat being transmitted primarily through said thinner wall.

4. A method as recited in claim 1 including the step of frosting said portion of the crucible above melt surface to locally change the emissivity thereof, the heat being locally absorbed to a greater extent at the frosted portion than elsewhere.

5. A method as recited in claim 1, wherein the housing includes an upper part supported by a plurality of pins mounted to a lower part with an opening between such parts through which the heat is transmitted.

* * * * *